United States Patent [19]

Maruyama et al.

[11] Patent Number: 5,783,367
[45] Date of Patent: Jul. 21, 1998

[54] PROCESS FOR PRODUCTION OF SEMICONDUCTOR DEVICE AND RESIST DEVELOPING APPARATUS USED THEREIN

[75] Inventors: Takashi Maruyama, Tokyo; Tatsuo Chijimatsu, Kawasaki; Koichi Kobayashi, Yokohama; Keiko Yano; Hiroyuki Kanata, both of Kawasaki, all of Japan

[73] Assignee: Fujitsu Limited, Kawasaki, Japan

[21] Appl. No.: 379,025

[22] Filed: Jan. 27, 1995

Related U.S. Application Data

[63] Continuation of Ser. No. 13,668, Jan. 28, 1993, abandoned, which is a continuation of Ser. No. 630,650, Dec. 20, 1990, abandoned, which is a continuation-in-part of Ser. No. 575,875, Aug. 31, 1990, abandoned.

[51] Int. Cl.$^6$ ........................................ G03F 7/30
[52] U.S. Cl. ........................ 430/313; 430/325; 430/330
[58] Field of Search ............................. 430/311, 313, 430/322, 323, 325, 326, 330

[56] References Cited

U.S. PATENT DOCUMENTS

| | | | |
|---|---|---|---|
| 3,961,101 | 6/1976 | Barton | 430/331 |
| 4,722,883 | 2/1988 | Koibuchi | 430/323 |
| 5,223,377 | 6/1993 | Samarakone | 430/330 |

FOREIGN PATENT DOCUMENTS

| | | | |
|---|---|---|---|
| 2 284 907 | 9/1975 | France . | |
| 56-148831 (A) | 11/1981 | Japan . | |
| 56148831 | 11/1981 | Japan . | |
| 58-214151 (A) | 12/1983 | Japan . | |
| 1-61914 (A) | 3/1989 | Japan . | |
| 1-61915 (A) | 3/1989 | Japan . | |
| 1-61916 (A) | 3/1989 | Japan . | |
| 161915 | 3/1989 | Japan . | |
| 1282550 | 11/1989 | Japan | 430/330 |

OTHER PUBLICATIONS

Moreau "Contrast & Sensitivity Enhancement of Resists for High–Resolution Lithography" J.Vac.Sci. Technol. B6(6), Nov. 1988, pp. 2238–2244.

*Primary Examiner*—Kathleen Duda
*Attorney, Agent, or Firm*—Staas & Halsey

[57] ABSTRACT

In the production of semiconductor devices, a pattern-wise exposed resist coating is developed with a developer to form a resist pattern corresponding to the pattern of exposure radiation on an article to be fabricated. The development being carried out with a developer consisting of one or more organic solvents, in at least two stages and in each stage of the development, the development is interrupted when a substantial permeation of the developer of a surface portion of the pattern-forming area of the resist pattern in which the resist pattern remains is completed, and the developed resist coating is dried between this stage and the following development stages. The development of the exposed resist coating is carried out by using a developing apparatus which comprises at least one set of developer-supplying system and rinsing solution-supplying system, and a conveyor means for guiding the article carrying the resist coating.

21 Claims, 20 Drawing Sheets

RESIST THICKNESS INCREASING RATIO
VERSUS DEVELOPING TIME

STANDARD DEVELOPING TIME PER CYCLE
VERSUS MOLECULAR WEIGHT (M.W.) OF
RESIST MATERIAL

PROCESS FOR PRODUCTION OF SEMICONDUCTOR DEVICE AND RESIST DEVELOPING APPARATUS USED THEREIN

This application is a continuation of application Ser. No. 08/013,668, filed Jan. 28, 1993, now abandoned, which is a continuation of application Ser. No. 07/630,650, filed Dec. 20, 1990, now abandoned, which in turn was a continuation-in-part of application Ser. No. 07/575,875, filed Aug. 31, 1990, now abandoned.

BACKGROUND OF THE INVENTION

1. Field of the Invention

The present invention relates to a process for the production of a semiconductor device. More particularly, the present invention relates to a process for a high precision forming of a resist pattern valuable for use as a mask at the step of selectively etching a semiconductor substrate, silicon oxide film or polycrystalline film (generally called "workpiece" hereinafter) or injecting ions into the workpiece in the production of a semiconductor device such as an LSI. Namely, the present invention relates to an improvement in the resist-forming process, and the development process for forming a resist. The present invention also relates to an apparatus for carrying out the production process of a semiconductor device, particularly a developing apparatus for developing the exposed resist coating.

2. Description of the Related Art

For the formation of a semiconductor device, the patterning of a silicon oxide film, a polycrystalline silicon film, an aluminum film or the like is carried out by etching, and a photoresist material (photosensitive resin material) having a high resolution, high etching resistance, and high sensitivity is used for fine patterning operation. In general, patterning of the workpiece such as a silicon oxide film is conducted according to the procedures shown in FIG. 1. Namely, first a photoresist film is formed on the workpiece. As the negative-working photoresist material suitable for use for this purpose, there can be mentioned, for example, polymeric materials such as a polystyrene and rubber type material. The photoresist material is coated on the workpiece by the spin coating method to form a photoresist film, and the formed photoresist film is then exposed to a pattern of light to which the photoresist material is sensitive, whereby a latent image corresponding to this pattern is formed in the photoresist film. Where the exposure light source uses ultraviolet rays, this patterning exposure is effected by the entire surface light exposure using a mask having a predetermined pattern, which is placed on the photoresist film. Where the exposure light source uses a high-energy radiation such as an electron beam (EB), the patterning exposure is directly carried out by using an EB exposure apparatus. After the patterning exposure, the exposed photoresist film is developed. The development is carried out, for example, by immersing the workpiece in a liquid developer such as an organic solvent, for example, esters and alcohols, or an aqueous alkali solution. As a result of this development, the unexposed area is dissolved and removed, and thus a negative resist pattern is obtained. In the usual resist-forming process, rinsing is generally carried out for removing the adhering liquid developer, followed by drying. Then, the workpiece as the substrate is selectively etched by using the obtained resist pattern as a mask. This etching is performed by the dry process or the wet process according to the characteristics of the photoresist material. Namely, a desired resist pattern can be formed on the workpiece through the series of the above-mentioned process steps.

Nevertheless, this conventional resist-patterning process is defective because in some resist processes the development is attained only with the use of an organic solvent as a developer. In such processes, if it is intended to conduct a fine patterning of resist, a deformation or shift occurs in the obtained resist pattern. These problems will now be described with reference to the resist-patterning process using a negative photoresist material (see FIGS. 2A through 2E).

First, as shown in FIG. 2A, a negative photoresist material is coated on a film 40 to be processed (aluminum film in this case), which is formed on a semiconductor (silicon) substrate 50, by a spincoating method, to form a photoresist film 41. The photoresist material used is chloromethylated polystyrene, and the thickness of the formed photoresist film is 1.5 µm.

Then, as shown in FIG. 2B, patterning exposure is carried out at 1 µm-line and 1 µm-space by using an electron beam as the light source. This light exposure causes the photoresist film 41 of the exposed region to be insoluble by the liquid developer to be used at the next step.

After the patterning exposure, as shown in FIG. 2C, the workpiece is immersed in a liquid developer and the photoresist film 41 of the unexposed region is dissolved and removed. The liquid developer used is a mixture of isoamyl acetate and ethyl cellosolve (9:1).

Then, the workpiece is drawn up from the liquid developer and is rinsed and dried (not shown in the drawings), whereby a negative resist pattern 41 as shown in FIG. 2D is obtained. In principle, the resist pattern should be formed at the position indicated by dot lines, but because of a meandering caused by a swelling of the resist material, the resist pattern 41 is shifted to the right and is inclined. From our experiments, it has been confirmed that the shift of the resist pattern 41 is about 0.3 µm on the lower end and about 0.5 µm on the upper end. In some cases, the resist pattern 41 is caused to shift to the left and is inclined, as shown in FIG. 3, or when the aspect ratio of the resist pattern 41 is large, as shown in FIG. 4, shoulders of adjacent patterns overlap each other. The shift and wavy deformation of the resist pattern 41 shown in FIG. 2D will become more apparent from the perspective view of FIG. 5.

If the film 40 to be processed is etched by using this defective resist pattern as the mask, the film 40 is patterned only in the meandering state with a shift of about 0.3 µm, as shown in FIG. 2E, and the presence of this defect results in a reduction of the yield of the final product.

In the resist-patterning process using a positive photoresist material such as polymethacrylate, since the pattern-left (i.e., remaining resist pattern) area is large, the problem of a formation of cracks on the pattern edge often arises, due to a swelling of the resist with an organic solvent. More specifically, where a rectangular window 42 indicated by dot lines in FIG. 7 is opened on the positive photoresistive film 41 on the film 40 to be processed, as shown in FIG. 6, a deformation of the window is caused by a swelling of the resist resin, and cracks 43 are formed on the pattern edge.

Some conventional techniques concerning improvements of the developing process are known but they are essentially different from the present invention and do not contribute to the completion of the present invention. For reference, these techniques will now be briefly discussed.

The invention disclosed in Japanese Unexamined Patent Publication (Kokai) No. 63-233530 relates to a pattern-forming process, especially a pattern-forming process valuable for obtaining an overhanging photo resist by the lift-off process. According to this invention, the development using an alkali liquid developer is once interrupted, the used liquid developer is washed and removed with pure water, and the development is conducted again with the same liquid developer. If the development is thus interrupted, even when the development-interrupted portion is subjected to another development, the development speed is lower than the usual development speed, and accordingly, the desired overhanging pattern can be easily formed.

The invention disclosed in Japanese Unexamined Patent Publication (Kokai) No. 64-61915 also relates to a pattern-forming process. According to this invention, in the process where a positive resist film is light-exposed, developed, water-washed and dried, the operation of reducing the developing speed on the surface of the positive resist or on the surface of the new resist formed by the development is repeated a plurality of times during the development using an alkali liquid developer, or before and during the development. Water washing and drying after the interruption of the development are effective as the means for reducing the developing speed. If the developing speed of the region not irradiated with electron beams is thus reduced, the proximity effect is reduced and a pattern having a high dimensional precision and a high contrast can be formed. Nevertheless, it should be noted that, since the pattern-forming processes described in this and the above-cited Japanese Kokais do not use an organic solvent as a developer, they cannot avoid the problem of resist swelling.

With regard to the problem of resist swelling, of course, this swelling can be controlled by changing the composition of the liquid developer or the developing temperature or by changing the composition of the photosensitive polymer used as the photoresist, but a satisfactory effect cannot be obtained. Therefore, the development of a process for the production of a semiconductor device in which, when developing a latent image of a photoresist film, the visualization is accomplished at a high precision and a film to be processed can be patterned by using the formed photoresist film as a mask, is desired.

SUMMARY OF THE INVENTION

A first object of the present invention is to form a resist pattern at a high precision without a deformation or shift of the resist pattern or a formation of cracks on the pattern edge.

A second object of the present invention is to provide a developing apparatus for developing the pattern-wise exposed resist coating with a developer, which apparatus is particularly useful in an intermittent development of the present invention which will be described hereinafter. It is desired to enable an exact control of the developing time of the resist coating and also an uniform development of the resist coating throughout the article to be fabricated or wafer carrying the resist coating.

In accordance with the present invention, the first object can be attained by a process for the production of a semiconductor device, which comprises the steps of:
coating a resist material on a workpiece to form a resist film or coating;
exposing the resist film to a predetermined pattern of radiation to form a latent image corresponding to the pattern of radiation in the resist film;
developing the pattern-wise exposed resist film with a liquid developer comprising one or more organic solvents to form a resist pattern corresponding to said radiation pattern on the workpiece, said development being carried out dividedly in at least two stages, the development of each stage being stopped when the liquid developer permeates substantially only the surface layer portion of the pattern-forming region to be left as the resist pattern in the resist film, and the resist film being dried between the successive performances of the two developing stages; and
selectively processing the workpiece by using, as a mask, the resist pattern obtained by said multi-staged development.

The process of the present invention is valuable for the formation of either a positive resist pattern or a negative resist pattern, and whether a positive resist pattern or a negative resist pattern is formed depends on the resist material to be used. As described hereinafter, an optional resist material is appropriately selected among a variety of resist materials according to desired results and other factors. Moreover, the resist materials to be used in the invention can have a sensitivity to light from various light sources, and in the instant specification, the word "light" or "radiation" is used in a broad sense, and a variety of light sources ranging from high-energy radiant light such as electron beams and ion beams to X-rays and ultraviolet rays can be used.

According to the present invention, by repeating the operations of supplying a liquid developer to a resist film having a latent image formed by the light exposure and drying the resist film slightly impregnated with the liquid developer in sequence, the resist film is intermittently patterned to effect the visualization, i.e., the structural implementation, or formation of the latent image. Therefore, the intrusion of the liquid developer can be confined only to the surface layer portion of the resist film, and the liquid developer is prevented from permeating into the deep portion of the resist film, with the result that a deformation or other defect due to a swelling of the resist film can be minimized or prevented in the formed pattern, and thus the development precision can be increased.

In addition, according to the present invention, the second object can be attained by a developing apparatus for developing the pattern-wise exposed resist coating with a developer, which comprises the following means:
at least one set of developer-supplying system which essentially consists of a distributor for applying the developer onto the resist coating connected with a source of developer and optionally a distribution control means of restricting the distribution of the developer to a predetermined limited area of the resist coating, and rinsing solution-supplying system which essentially consists of a distributor for applying the rinsing solution onto the developed resist coating connected with a source of rinsing solution and optionally a distribution control means of restricting the distribution of the rinsing solution to a predetermined limited area of the resist coating; and
a conveyor means for guiding the article carrying the resist coating from a zone of the developer-supplying system to a zone of the rinsing solution-supplying means under such conditions that the distributor of the developer and the distributor of the rinsing solution are opposed, in sequence, to a surface of the resist coating of the moving article.

The developer and rinsing solution both can be applied from the distributor thereof to the resist coating by using any conventional manners. Preferably, dropping and spraying are used to conduct the application of the developer or rinsing solution.

DESCRIPTION OF THE PREFERRED EMBODIMENTS

Figure 1:
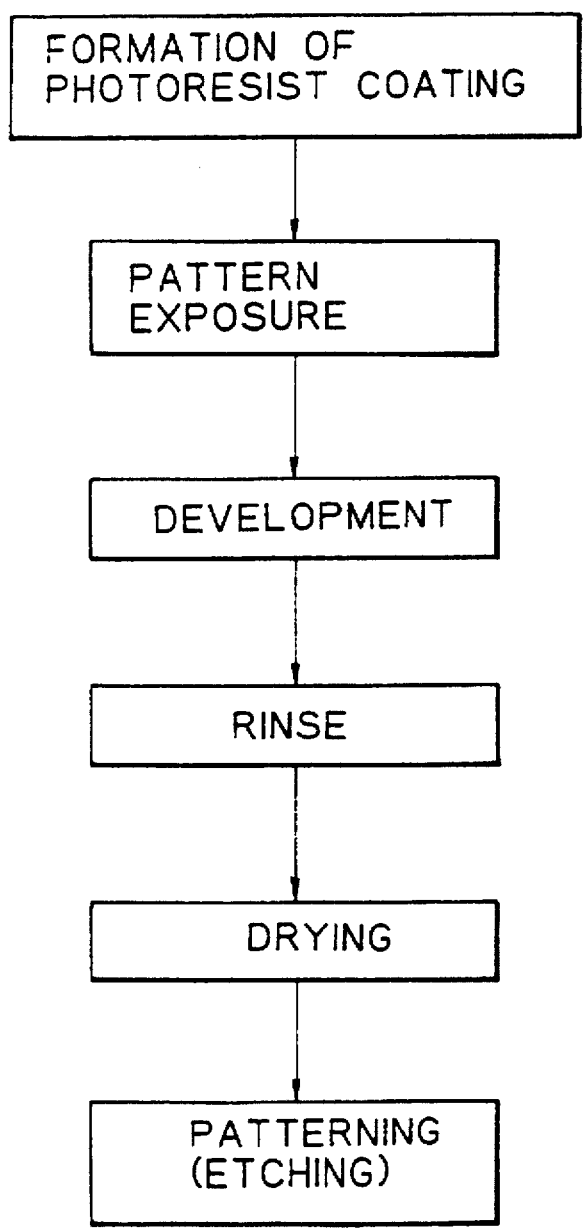
FIG. 1 is a flow sheet illustrating the conventional resist-patterning process along the flow thereof.
Figure 2A:
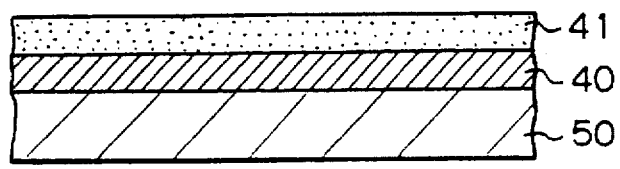
FIGS. 2A through 2E are sectional views illustrating steps of the conventional negative resist-patterning process in sequence.
Figure 2B:
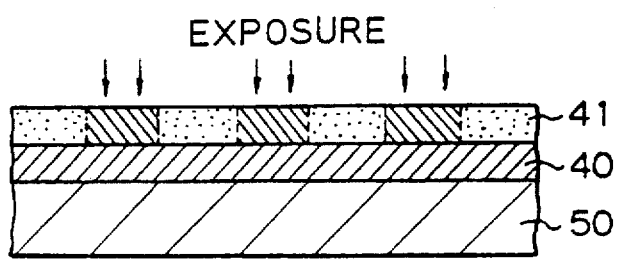
Figure 2C:
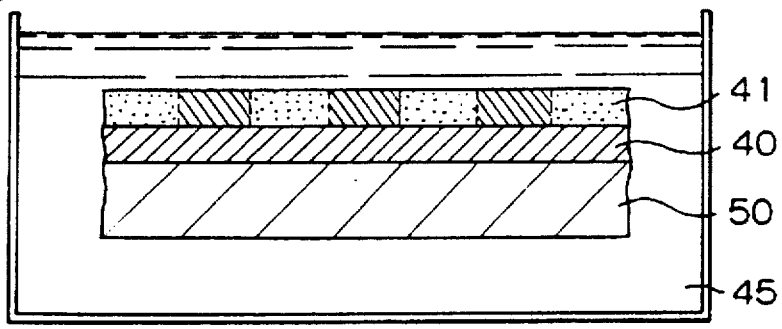
Figure 2D:
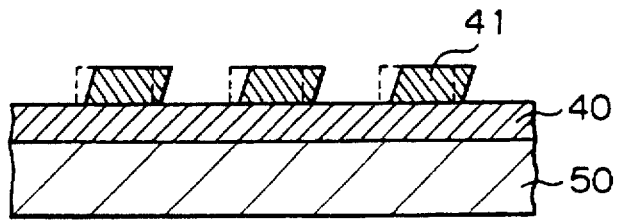
Figure 2E:
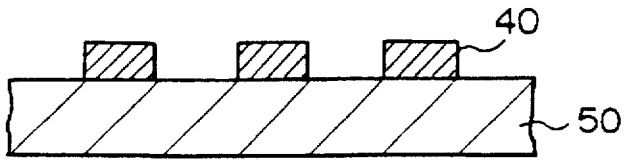
Figure 3:
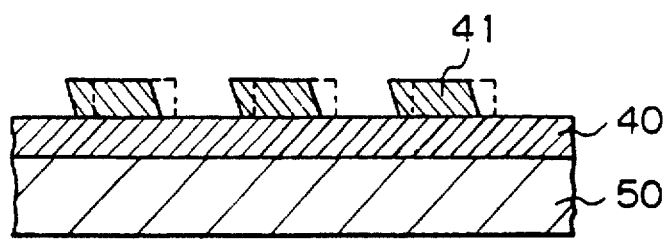
FIGS. 3 and 4 are sectional views showing the defects of the conventional negative resist-patterning process.
Figure 4:
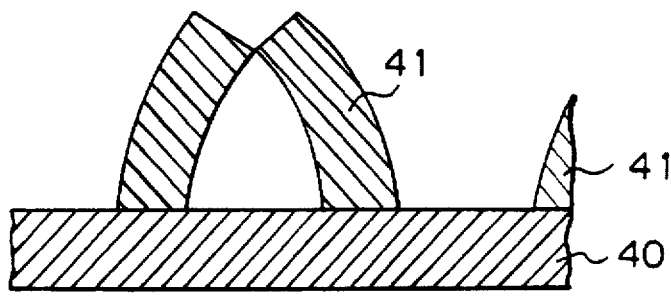
Figure 5:
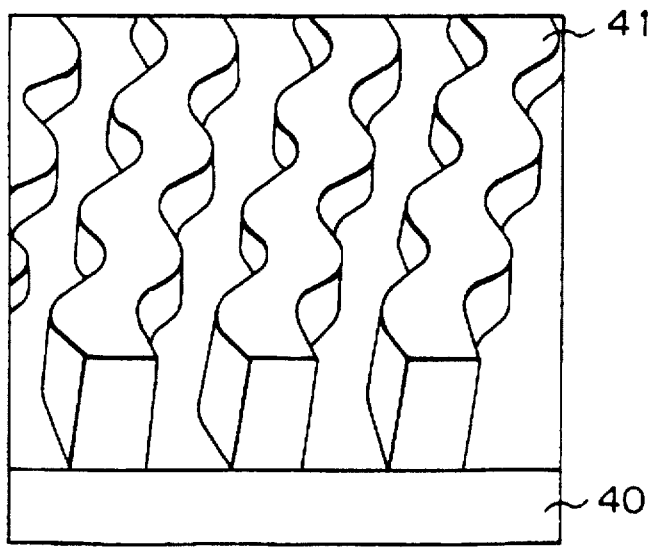
FIG. 5 is a sectional view illustrating the defects of the conventional negative resist-patterning process.
Figure 6:
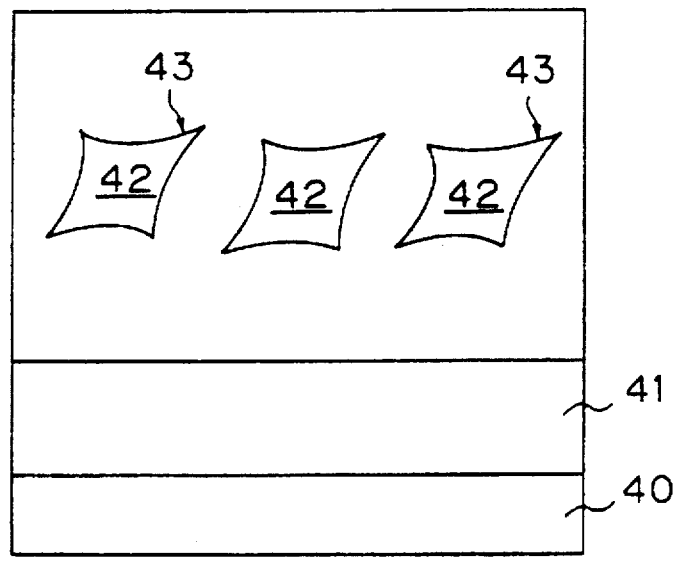
FIGS. 6 and 7 are perspective and plane views illustrating the defects of the conventional positive resist-patterning process.
Figure 7:
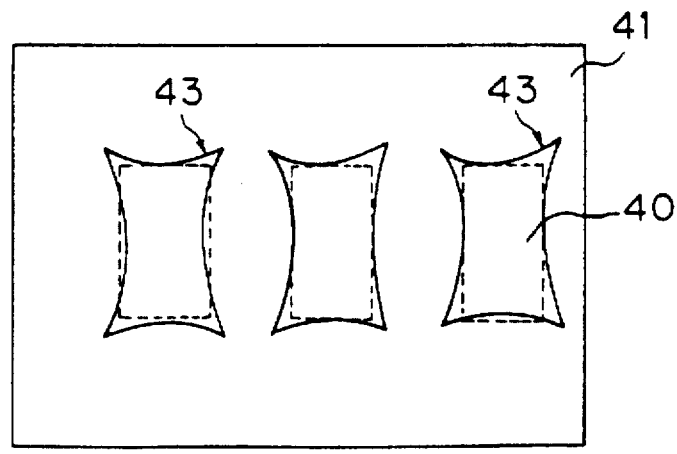
Figure 8:
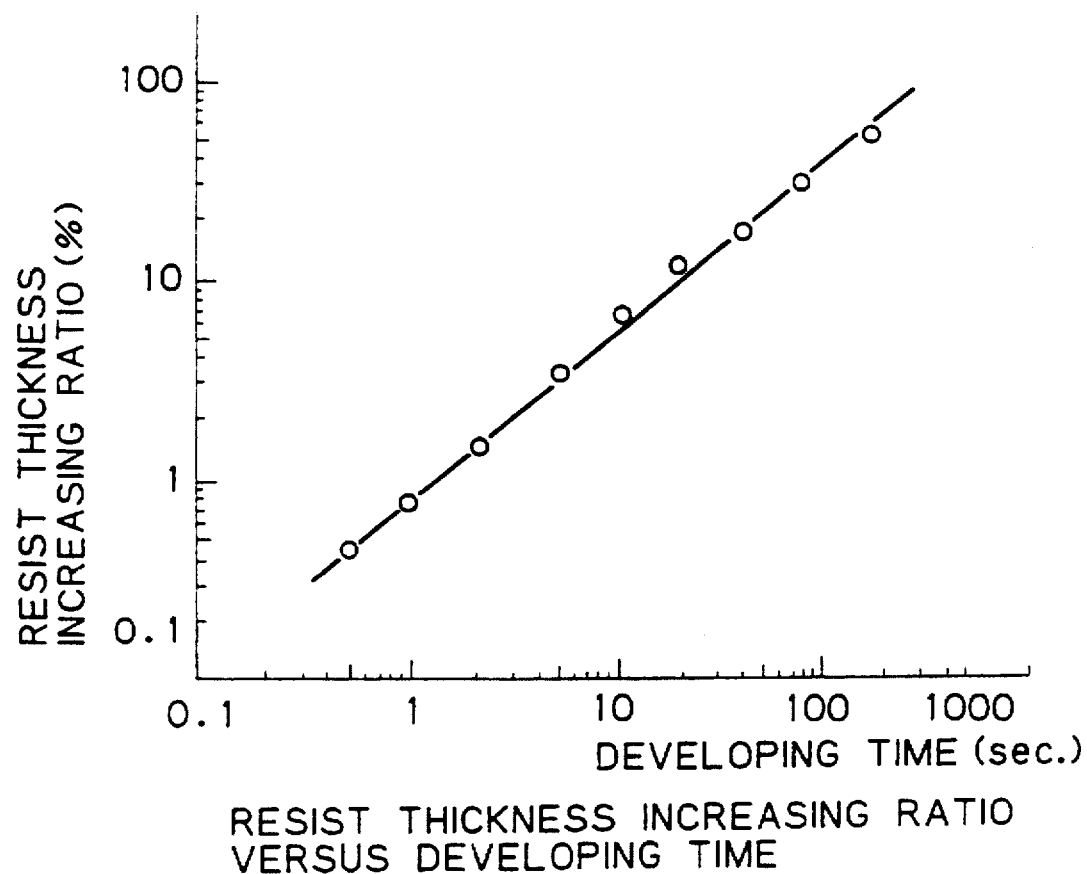
FIG. 8 is a characteristic curve illustrating the relation between the development time and the thickness increasing ratio in the photoresist film.

In view of the close relationship between the swelling of the photo resist material and the developing step, the inventors carried out experiments with a view to clarifying the relationship between the developing time and the thickness increasing ratio of the photoresist film, and the results plotted in FIG. 8 were obtained. Namely, the relationship between the film thickness-increasing speed of a negative electron beam resist, i.e., chloromethylated polystyrene, and the developing time was measured by detecting a change of the intensity of the reflected light. The initial resist film thickness of 1.64 μm and the electron beam dose was 35 μC/cm². The resist film thickness increased with an increase of the development time, and when the development was conducted for 200 seconds, the thickness increased to 180% of the initial film thickness. Based on this finding investigations were made with a view to shortening the development time, and as a result, the present invention previously described and also described hereinafter was completed.

According to the present invention, after a latent image is formed by the light exposure of a resist film, the operations of supplying a liquid developer to the resist film and drying the resist film slightly impregnated with the liquid developer are repeated several times in succession, whereby the resist film is intermittently patterned and the latent image is visualized.

Accordingly, an intrusion of the liquid developer is confined to the surface layer portion of the photoresist film, and a deep permeation of the liquid developer can be controlled so as to be avoided, and deformation of the resist pattern by swelling is reduced, with the result that the development precision can be increased.

In the present invention, the step of removing the liquid developer by rinsing can be interposed between the developing and drying steps, according to need, and an embodiment in which these three steps are repeated a plurality of times in sequence is included in the scope of the present invention.

According to the present invention, especially prominent effects can be attained when a crosslinking resist causing a large swelling of a liquid developer is used, and prominent effects are attained when an organic solvent is used as the liquid developer and a crosslinking photosensitive polymer is used as the resist material. By the crosslinking resist material is meant a resist material in which a pattern is formed based on the difference of the dissolution owing to the difference of the crosslinking degree.

Figure 9:
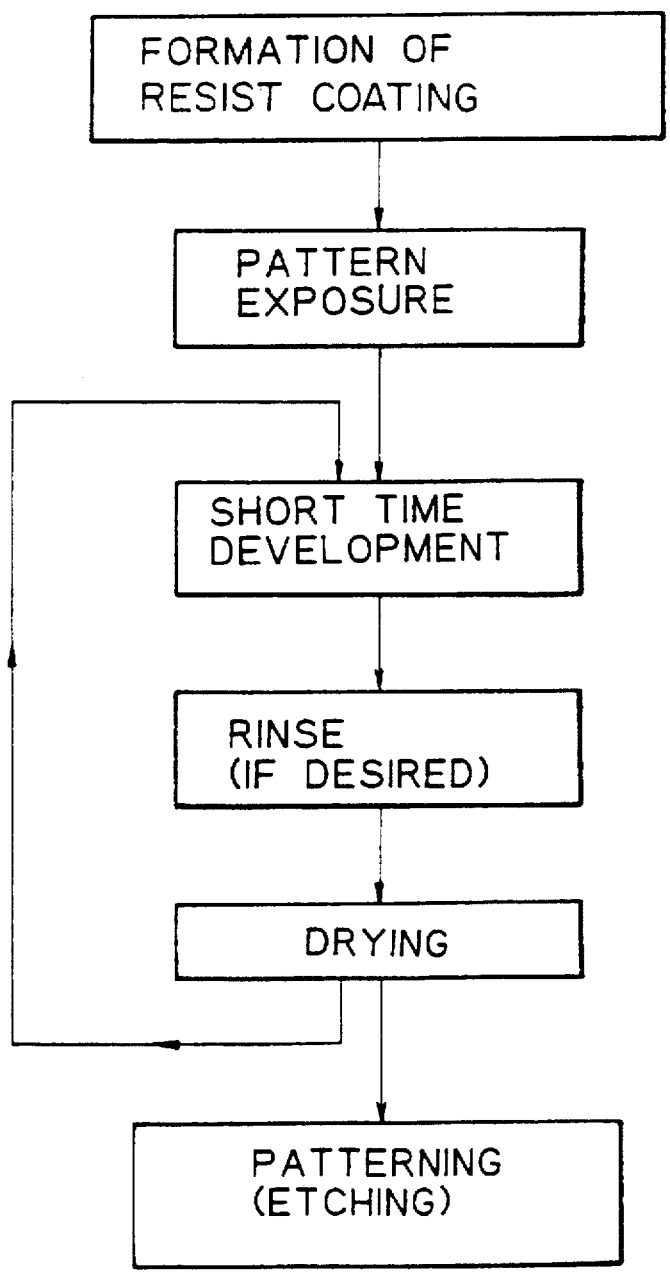
FIG. 9 is a flow sheet illustrating the resist-patterning process in the process of the present invention along the flow thereof.

The process for the production of a semiconductor device according to the present invention, especially the resist-patterning process, can be worked by the procedures shown in FIG. 9.

First, a resist material is coated on a workpiece (or a film to be processed) to form a resist film. A photosensitive polymer is preferably used as the resist material. As preferred examples of the photosensitive polymer, there can be mentioned polystyrene, polysiloxanes, polyacrylates, polymethacrylates, cyclized rubbers, polyvinyl cinnamate, polysulfones, other crosslinking polymers and derivatives thereof. The spin coating method is advantageously adopted for coating the resist material, but other customary coating methods can be adopted if desired. The molecular weight of the photosensitive polymer advantageously used in the present invention, especially the photosensitive crosslinking polymer, can be changed within a broad range, but the molecular weight is preferably about 1,000 to about 1,000,000.

The formed resist film is then exposed to light or radiation of a predetermined pattern. When a electron beams are used as the light source, an electron beam exposure apparatus can be used, and when X-rays or ultraviolet rays are used as the light source, the patterning exposure can be carried out by using a photo-mask.

After the patterning exposure is completed, the cycle of short-time development and drying is repeated according to the present invention, and if necessary, rinsing can be conducted between the development and drying. In the present invention, the short-time development is conducted at least two times. At each stage, the development is stopped when the liquid developer permeates only the substantial surface layer portion of the pattern-forming region to be left as the resist pattern in the resist film. At each stage, the development is carried out for a time shorter than the time required for the swelling of the photosensitive polymer in the pattern-forming region of the resist film to become saturated. In the present invention, the development and rinsing (conducted according to need) can be performed by using various devices, but preferably the development and rinsing is carried out in a system where many nozzles for dropping a liquid developer and/or a rinsing liquid are arranged, as explained hereinafter with reference to FIG. 16, and developer supply nozzles 23 and rinsing liquid supply nozzles 24 are disposed alternately, and in such a manner that they are opposed to a semiconductor substrate 2.

Figure 19:
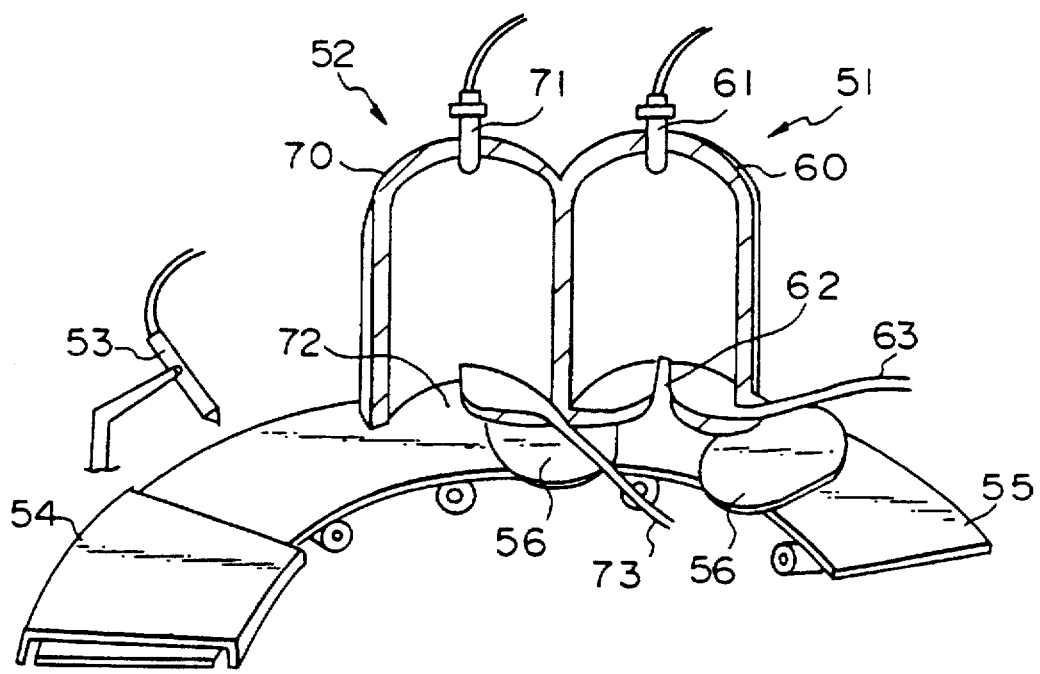
FIG. 19 is a perspective view illustrating the resist developing apparatus according to one preferred embodiment of the present invention.
Figure 20:
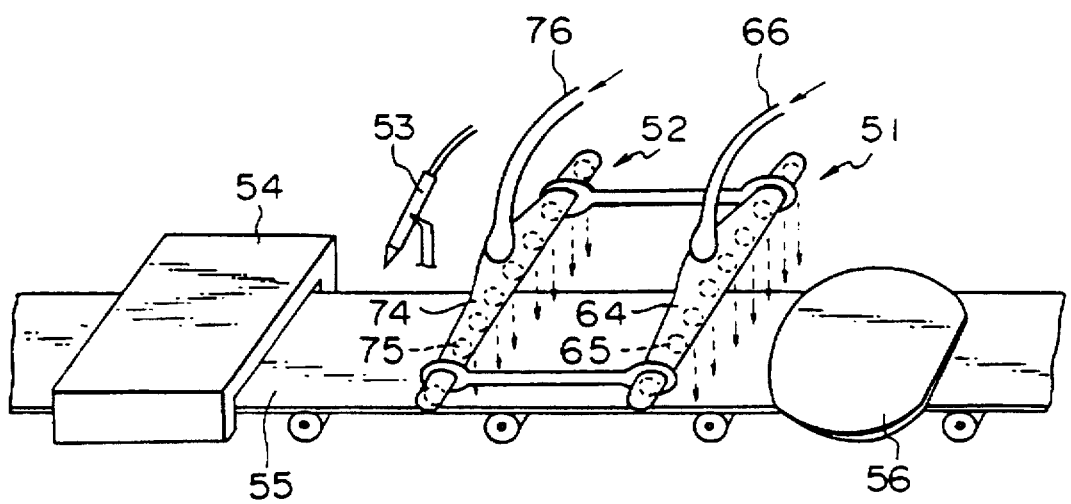
FIG. 20 is a perspective view illustrating the resist developing apparatus according to another preferred embodiment of the present invention; and, FIG. 21 is a perspective view illustrating the resist developing apparatus according to another preferred embodiment of the present invention.
Figure 21:
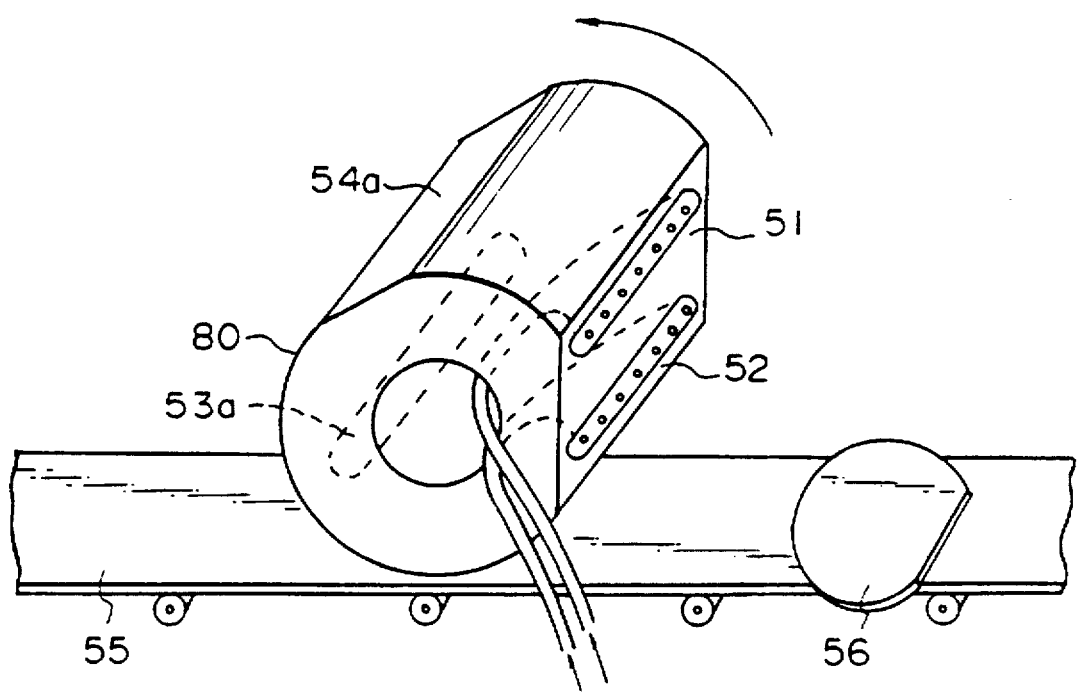

Alternatively, and more preferably, the development and rinsing of the exposed resist coating can be conducted by using, for example, resist developing apparatuses illustrated in FIGS. 19 to 21. Namely, the developing apparatuses of these figures, as described in the SUMMARY OF THE INVENTION, comprises the following means:

at least one set of developer-supplying system which essentially consists of a distributor for applying the developer onto the resist coating connected with a source of developer and optionally a distribution control means of restricting the distribution of the developer to a predetermined limited area of the resist coating, and rinsing solution-supplying system, which essentially consists of a distributor for applying the rinsing solution onto the developed resist coating connected with a source of rinsing solution and optionally a distribution control means of restricting the distribution of the rinsing solution to a predetermined limited area of the resist coating; and a conveyor means for guiding the article carrying the resist coating from a zone of the developer-supplying system to a zone of the rinsing solution-supplying system under such conditions that the distributor of the developer and the distributor of the rinsing solution are opposed, in sequence, to a surface of the resist coating of the moving article.

As previously mentioned, the developer and the rinsing solution each can be applied to the resist coating from any desired form such as droplets or spray.

In a preferred embodiment of the present invention, each of the developer-supplying system and the rinsing solution-supplying system of the developing apparatus comprises a chamber provided with a spraying nozzle for the developer or rinsing solution on a top portion of the chamber, and an opening having a size enough to restrict the distribution of the developer or rinsing solution to a predetermined limited area of the resist coating, on a bottom wall of the chamber.

In this developing apparatus, preferably, the opening of the bottom wall of the chamber has a surrounding wall upwardly projecting from the bottom wall of the chamber at a height enough to prevent an overflow of the sprayed developer or rinsing solution received in the bottom portion of the chamber from the opening thereof.

In another preferred embodiment of the present invention, each of the developer-supplying system and the rinsing solution-supplying system of the developing apparatus comprises a tubular body positioned over and across a guide path of the article carrying the resist coating, and through which the developer or rinsing solution is supplied, a bottom portion of the tubular body being provided with one or more arrays of holes for dropping the developer or rinsing solution onto the predetermined limited area of the resist coating.

In another preferred embodiment of the present invention, the resist developing apparatus comprises a rotatable drum having, applied on a circumferential surface thereof at a predetermined distance of space, a tubular body through which the developer is supplied and tubular body through which the rinsing solution is supplied, each tubular body being provided with one or more arrays of holes for dropping the developer or rinsing solution onto the predetermined limited area of the resist coating when the holes are opposed to such area during rotation of the drum.

In this developing apparatus, as shown in FIG. 21, preferably, the rotatable drum further comprises a means for removing the remaining rinsing solution on the rinsed resist coating and a means for drying the resist coating disposed in a downstream side to the removing means.

The illustrated developing apparatuses can solve a prior art problem that a developing time for the exposed resist coating in the intermittent development process must be exactly controlled because a configuration of the developed resist coating can be adversely affected by the contact time of the resist with the developer. Namely, for example, in the developing apparatus of FIG. 16, there were difficulties that it is difficult to exactly determine the contact time between the resist and the developer during development; since the developer is dropped onto a central area of the resist coating of the wafer and is diffused into an overall surface of the resist coating by the action of centrifugal force due to rotation of the wafer, a remarkable difference of the contact time of the resist with the developer between the central area and peripheral area of the wafer can be essentially caused. This difference of the contact time means that the development of the resist coating is not uniformly carried out in the intermittent development process. Of course, it should be noted that the illustrated developing apparatuses can be advantageously applied to conventional one-step development process, if desired, in addition to the intermittent development process.

Figure 18:
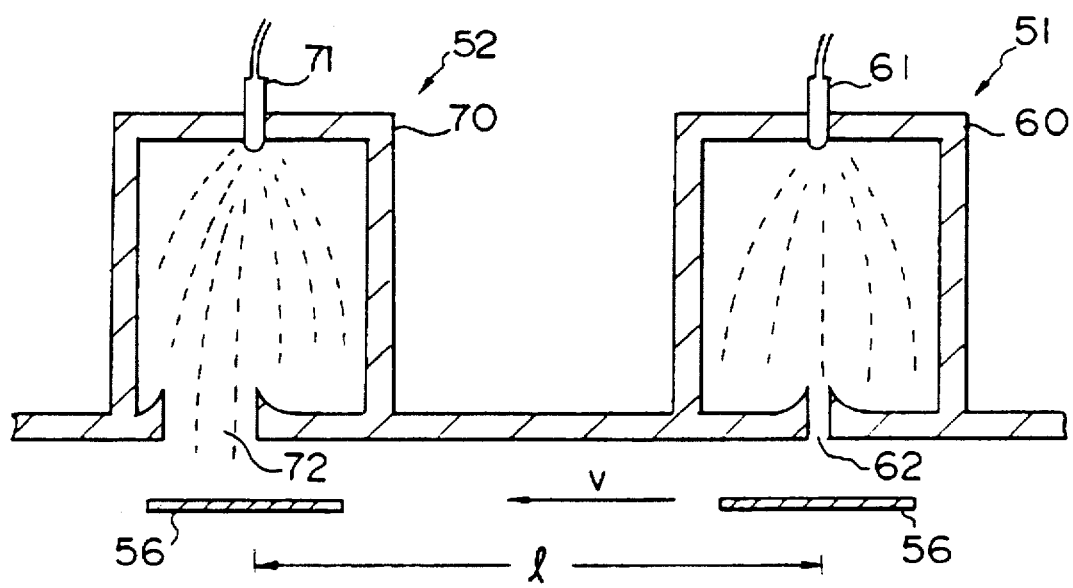
FIG. 18 is a sectional view illustrating a principle of the constitution of the resist developing apparatus according to the present invention.

A principle of the constitution of the resist developing apparatus according the present invention is illustrated in FIG. 18. The illustrated developing apparatus comprises one set of developer-supplying system 51 and rinsing solution-supplying system 52. The developer-supplying system 51 comprises a developing chamber 60 and a means for spraying the developer, i.e., spray nozzle 61, mounted on a top portion of the chamber 60. The spray nozzle 61 is connected through a conduit to a source of developer (not shown). A bottom wall of the chamber 60 has an opening 62 which can act as a distribution control means of restricting the distribution of the developer to a predetermined limited area of the resist coating of the wafer. Similarly, the rinsing solution-supplying system 52 comprising a rinsing chamber 70 and a means for spraying the rinsing solution, i.e., spray nozzle 71, mounted on a top portion of the chamber 70. The spray nozzle 71 is connected through a conduit to a source of rinsing solution (not shown). A bottom wall of the chamber 70 has an opening 72 which can act as a distribution control means of restricting the distribution of the rinsing solution to a predetermined limited area of the resist coating of the wafer. In this developing apparatus, if a distance between the opening 62 of the developing chamber 60 and the opening 72 of the rinsing chamber 70 has a length "l" cm, and a conveying speed of the wafer 56 carrying the resist coating (not shown) is controlled to "v" cm/sec., a time of contacting the resist coating with the developer, i.e., developing time "t", is calculated from the equation t=l/v sec. Accordingly, the developing time "t" can be exactly controlled to a desired value by freely changing the distance "l" or the conveying speed "v" of the wafer.

The sprayed developer from the nozzle 61 is continuously applied through the opening 62 of the developing chamber 60 over the resist coating of the moving wafer 56, and similarly, the sprayed rinsing solution from the nozzle 71 is continuously applied through the opening 72 over the developed resist coating of the moving wafer 56. Note, although only one developing and rinsing system is illustrated, preferably, two or more of these systems are connected in series to conduct an intermittent development process.

Surprisingly, it was found that, using the above-described development apparatus of the present invention, it becomes possible to attain an exact control of the developing time of the exposed resist, and also to conduct an uniform development of the resist in an overall surface of the resist coating. As a result of uniform development of the resist, a peel-off tendency, deformation and other defects of the developed resist due to swelling of the resist can be effectively prevented.

According to the present invention, by conducting the short-time development and drying repeatedly and intermittently as described above, the occurrence of problems such as shift and wavy deformation of the resist pattern and a formation of cracks can be prevented.

After the completion of the series of developing operations, the workpiece is selectively processed (subjected to etching or injection of ions) by using the obtained resist pattern as a mask. Since the resist pattern has a high precision and excellent characteristics such as resolving power, sensitivity and dry etching resistance, satisfactory processing is possible.

When a negative resist material is used, the process of the present invention is conducted according to procedures shown in sectional views of FIGS. 10A through 10H. In the drawings, reference numeral 1 represents a bi-polar transistor (bulk) formed on a semiconductor substrate 2. This bi-polar transistor 1 comprises a p-type collector layer 3, a p-type base layer 4 formed on the surface portion of the collector layer 3 and an n-type emitter layer 5 formed on the surface portion of the base layer 4. An interlaminar insulating film 9 composed of $SiO_2$ is formed on the bi-polar transistor 1, and an emitter window 6, a base window 7 and a collector window 8 are formed in the film 9 to expose the emitter layer 5, the base layer 4 and the collector layer 3, respectively.

Reference numeral 10 represents an aluminum film to be patterned through steps described below, i.e., a film to be processed. This aluminum film 10 is laminated to cover the interlaminar insulating film 9 and fill the interiors of the emitter window 6, base window 7, and collector window 8.

Figure 10A:
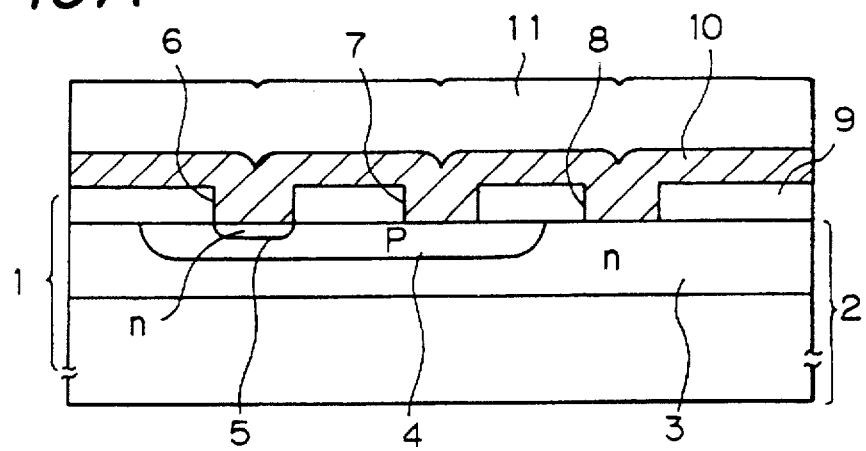
FIGS. 10A through 10H are sectional views illustrating steps in sequence in one embodiment of the present invention.
Figure 10B:
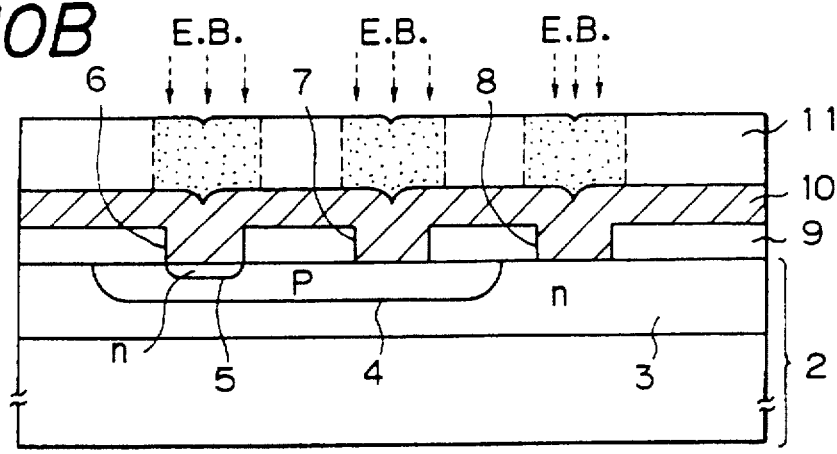

In this state, a negative resist material composed of chloromethylated polystyrene is coated on the aluminum film 10 by the spin coating method to form a resist film 11 having a thickness of 1.2 μm (see FIG. 10A).

The aluminum film 10 in the region to be left, i.e., in the portions located on the emitter window 6, base window 7, and collector window 8 and surrounding portions, is irradiated with electron beams to form a latent image in the resist film 11. At this step, the irradiation with electron beams is carried out, for example, under conditions of 30 kV and scores of $\mu C/cm^2$ (see FIG. 10B).

Figure 10C:
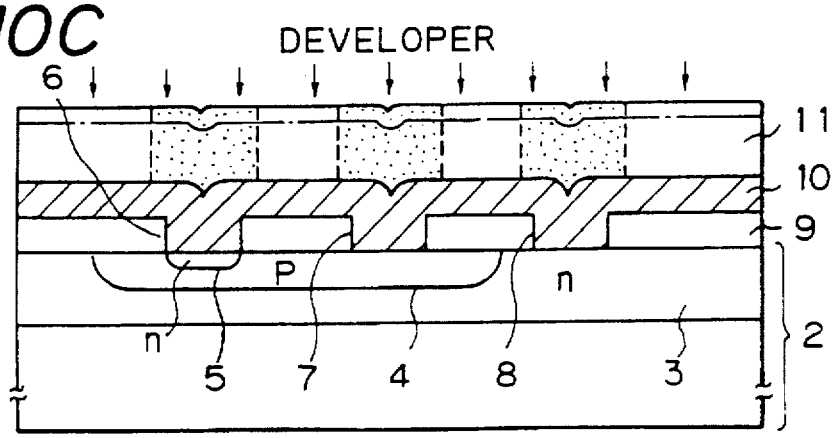
Figure 10D:
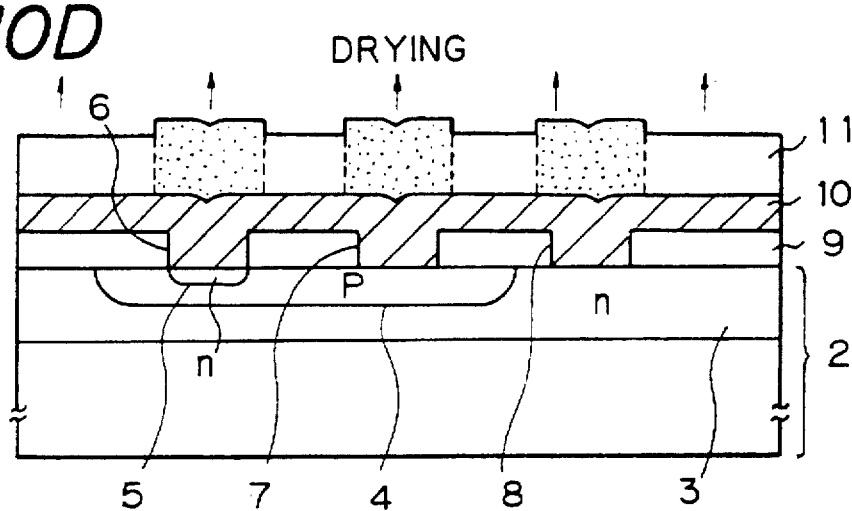
Figure 10E:
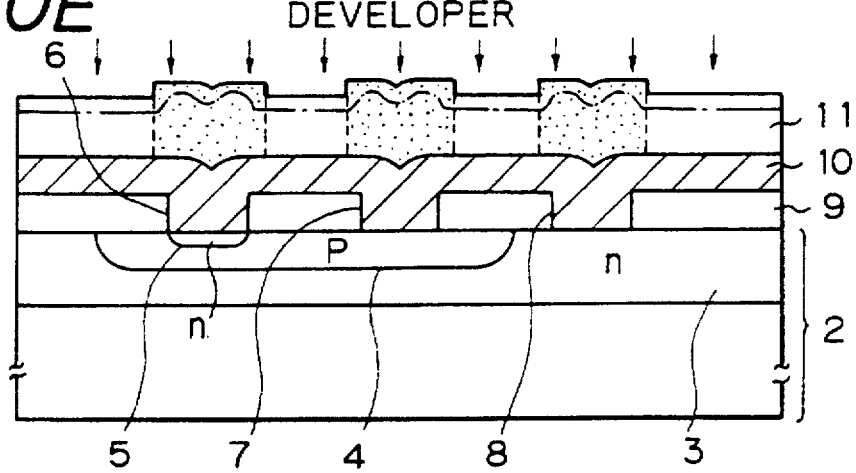
Figure 10F:
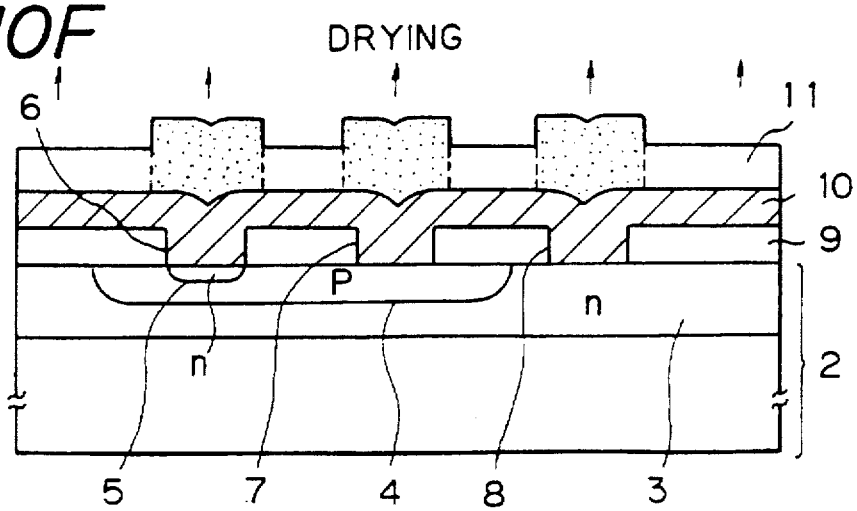
Figure 10G:
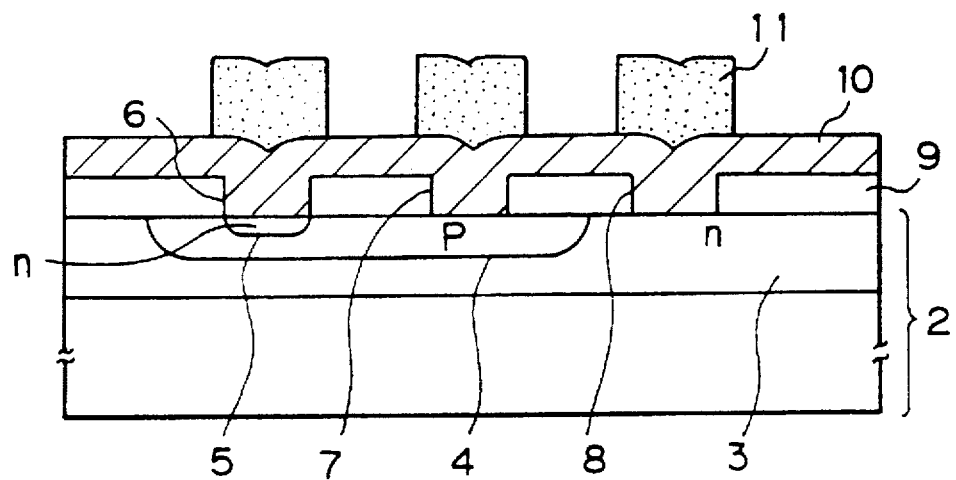
Figure 10H:
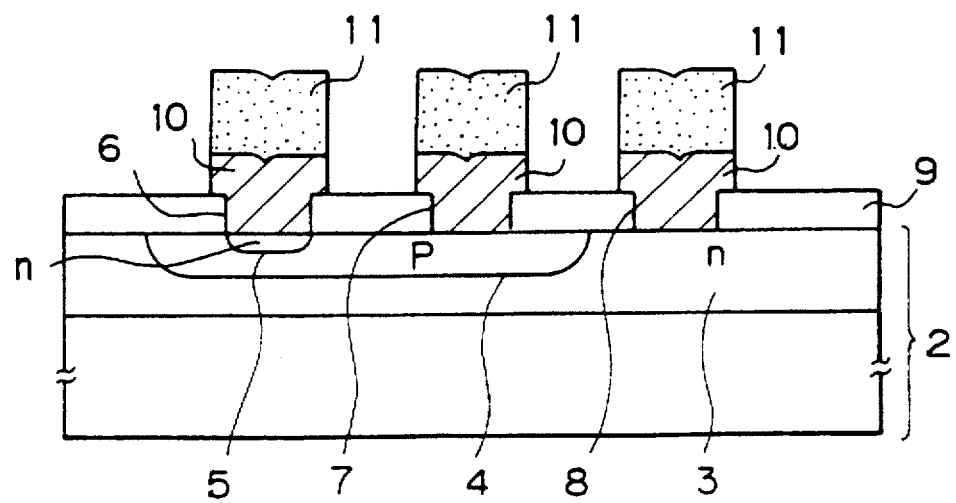
Figure 16:
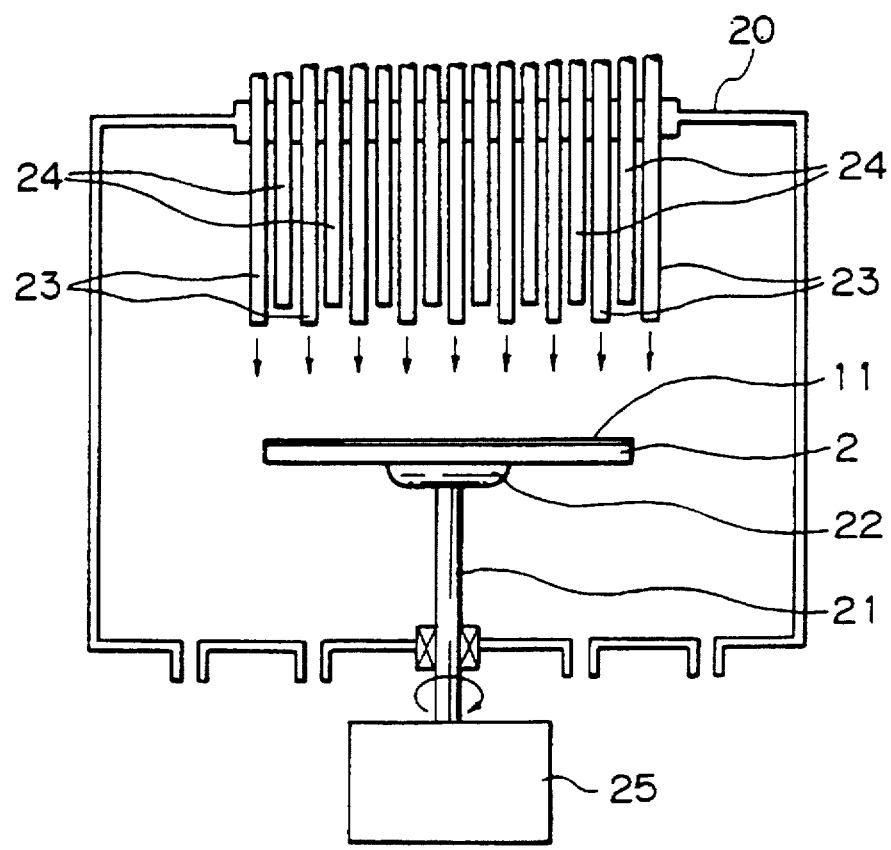
FIG. 16 is a sectional view illustrating an embodiment of the developing apparatus for use in working the present invention.

The semiconductor substrate 2 is then placed in a development chamber 20, as diagrammatically illustrated in FIG. 16, and the back surface of the semiconductor substrate 2 is fitted to a suction panel 22 arranged on the top end of a vacuum chuck 21 disposed in the development chamber 20 to fix the semiconductor substrate 2 by suction, so that the resist film 11 confronts a plurality of liquid developer supply nozzles 23 and rinsing liquid supply nozzles 24 arranged in parallel.

Where the vacuum chuck 21 is rotated by a driver 25, a liquid developer is jetted onto the resist film 11 from a plurality of the developer supply nozzles 23 (see FIG. 10C). As the liquid developer used at this step, there can be mentioned a liquid mixture containing acetone and isopropyl alcohol (4:1), and a solution containing ethyl cellosolve and isoamyl acetate (1:9).

The supply of the liquid developer is continuously conducted for a short time and then isopropyl alcohol (IPA) as the rinsing liquid is supplied to the resist film 11 for about 5 seconds, from the rinsing liquid supply nozzles 24, to wash away the liquid developer adhering to the resist film 11. Then the liquid developer 11, which has slightly permeated the surface layer portion of the resist film 11, is evaporated by an air current generated by the rotation of the substrate to effect drying. In this case, the rotation speed of the vacuum chuck 21 is adjusted from several hundred rpm to several thousand rpm.

The above-mentioned development, rinsing, and drying treatments are repeated scores of times or several hundred times, whereby the photoresist film 11 is intermittently developed while preventing the liquid developer from deeply permeating the resist film 11, and the latent image is visualized without deformation, exceeding the allowable range, of the pattern of the latent image (see FIGS. 10C through 10G).

Figure 11:
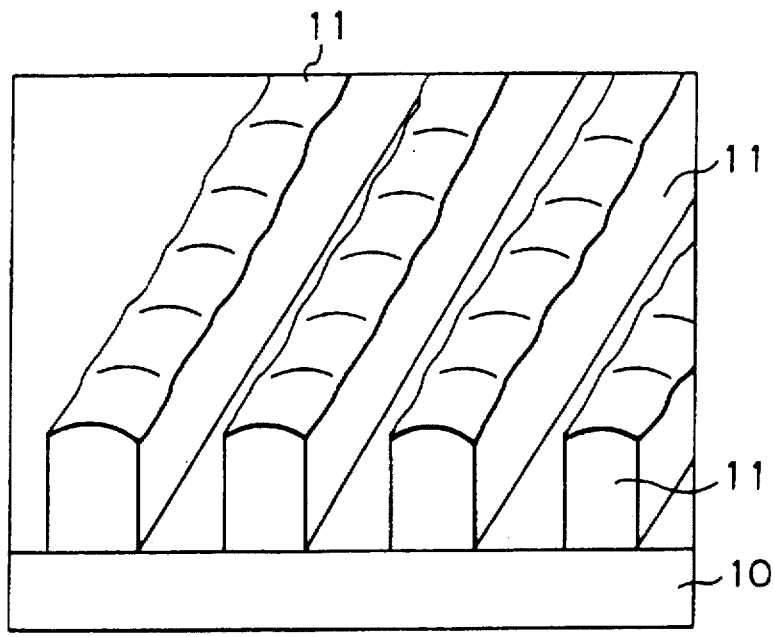
FIGS. 11, 12, 13 and 14 are perspective views illustrating resist films developed according to the present invention.
Figure 12:
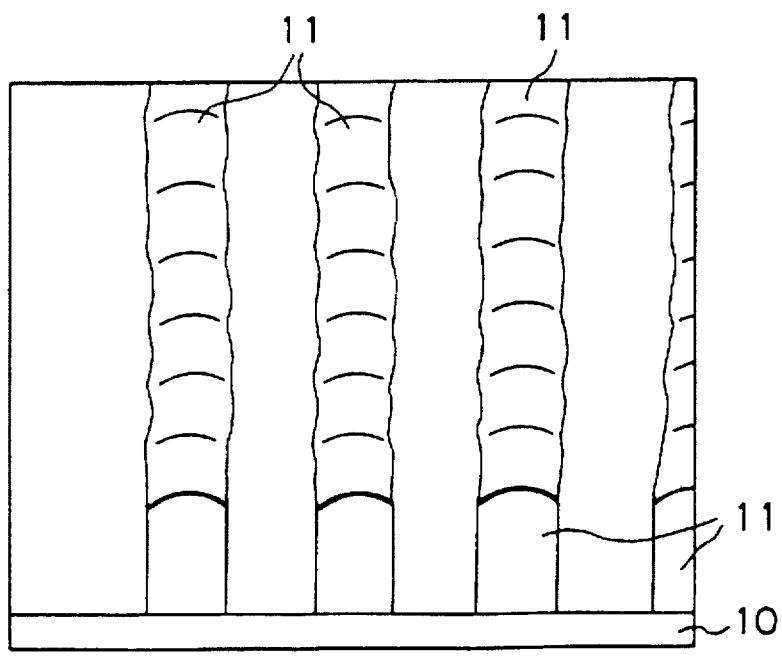
Figure 13:
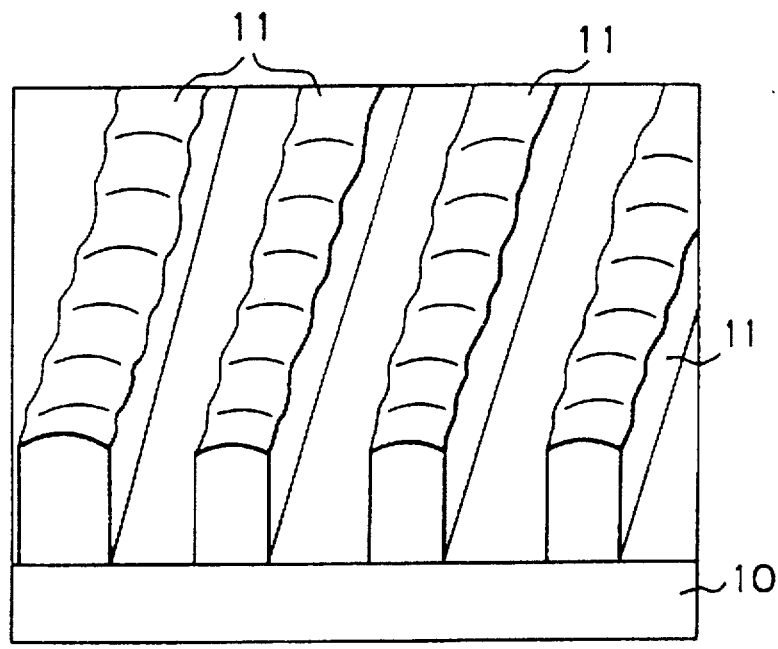
Figure 14:
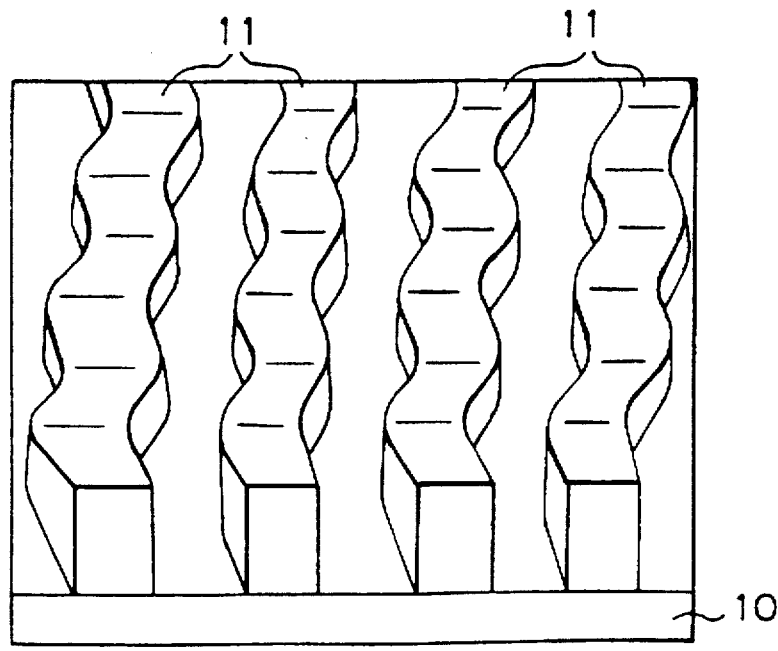
Figure 15A:
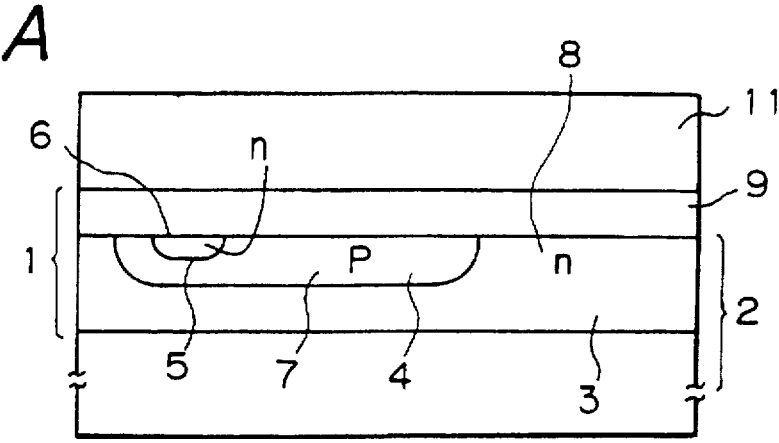
FIGS. 15A through 15H are sectional views showing the steps in sequence of another embodiment of the present invention.
Figure 15B:
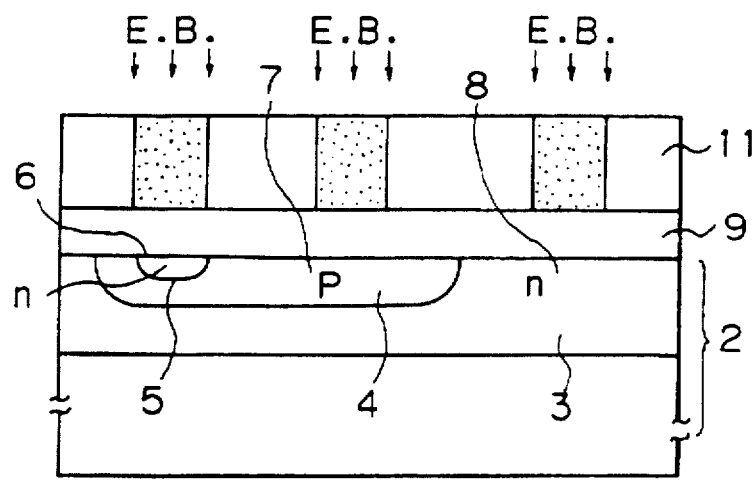
Figure 15C:
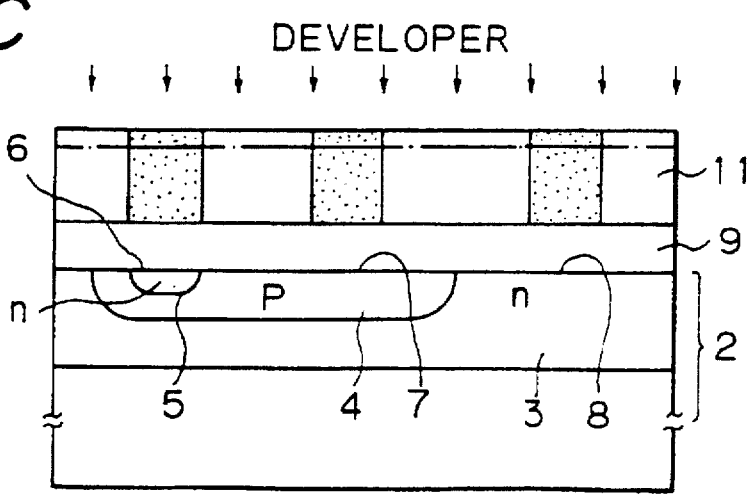
Figure 15D:
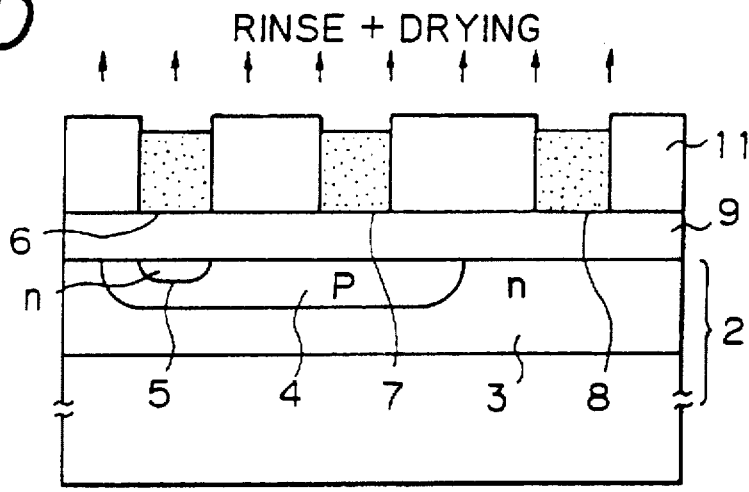
Figure 15E:
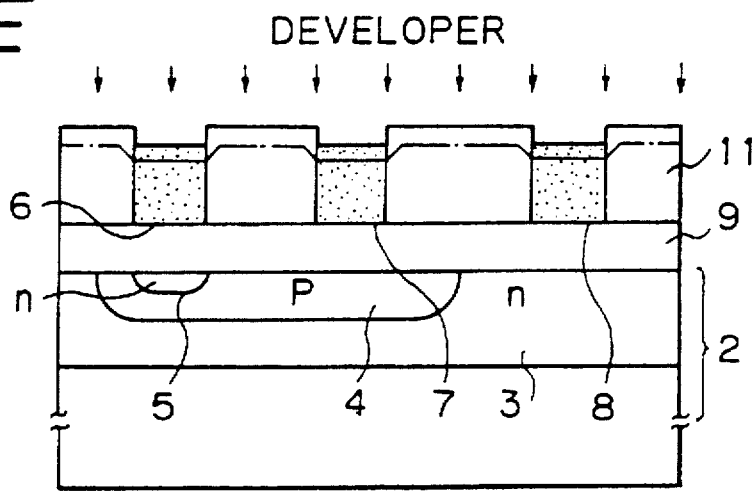
Figure 15F:
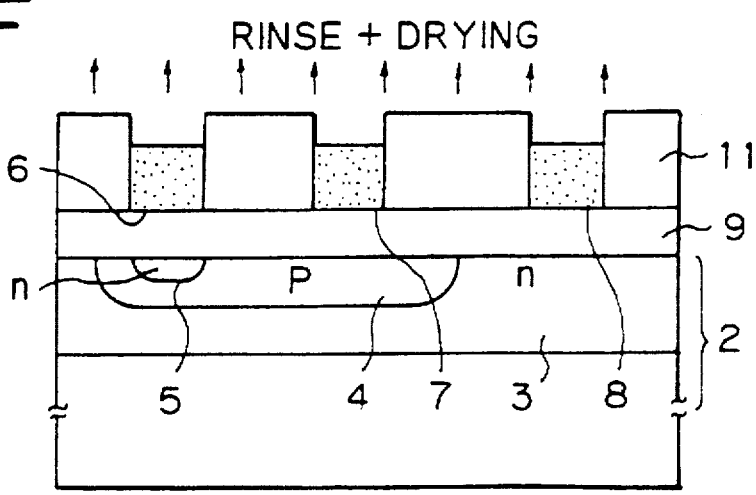
Figure 15G:
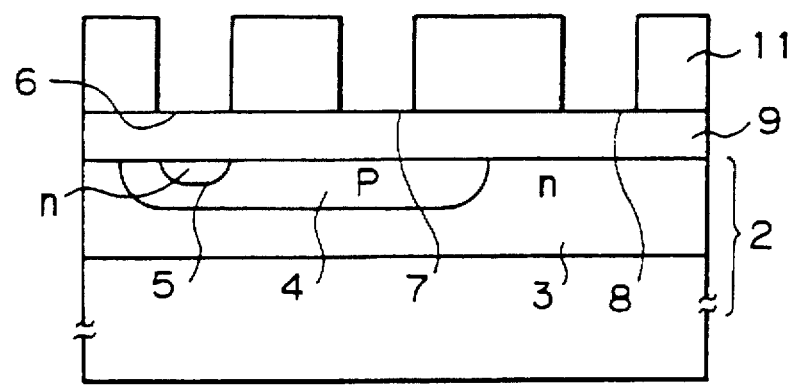
Figure 15H:
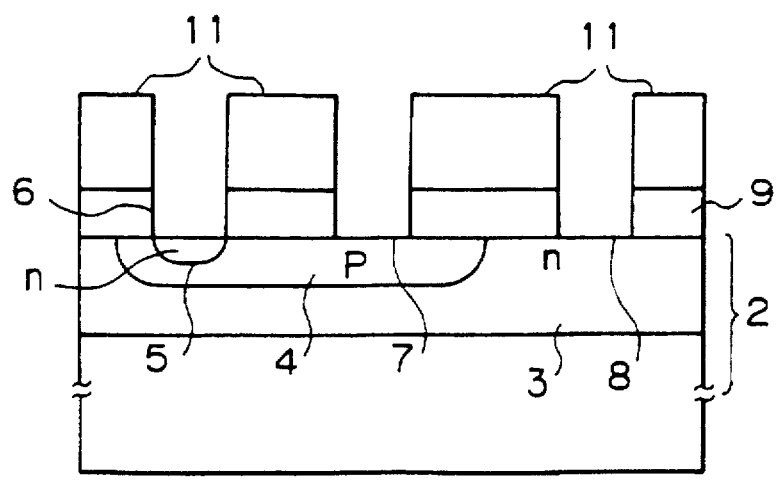

For example, the development time, rinsing time, and drying time are adjusted to 0.2 second, 5 seconds, and 5 seconds, respectively, and 125 cycles of these treatments are carried out so that the total development time is 25 seconds, whereby the development of the resist film 11 is effected and a plurality of stripe patterns having a thickness of 1.2 μm and a width of 0.7 μm are formed. Thus, the resist film 11 is developed in the state shown in FIG. 11 and a pattern having no deformation is formed. If the development time is adjusted to 0.5 second and the development, rinsing and drying treatments are repeated 50 times in the above-mentioned manner, a pattern having no substantial deformation is obtained, as shown in FIG. 12. If the development time is adjusted to 1.0 second and the development, rinsing and drying treatments are repeated 25 times, a slight deformation of the pattern is caused, as shown in FIG. 13. If the development time is adjusted to 2 seconds and the development is carried out 12 times intermittently, a wavy deformation is caused in the formed pattern, as shown in FIG. 14, and it is confirmed that the deformation is large in this case.

From the foregoing experimental results it is clarified that, when the development time of one cycle becomes long, the degree of the deformation of the pattern increases. This is considered to be because, if the development time is long, the resist film 11 absorbs the liquid developer and is consequently swollen, resulting in deformation of the pattern, and it is confirmed that the once deformed pattern cannot be restored to the original pattern even if drying is conducted afterward.

The molecular weight of the chloromethylated polystyrene used as the resist material in the foregoing embodiment is about 7,200. If the development time of one cycle is adjusted to about 0.5 second and the development, rinsing and drying treatments are repeated in sequence a plurality of times, the development is accomplished without any substantial deformation of the pattern.

Figure 17:
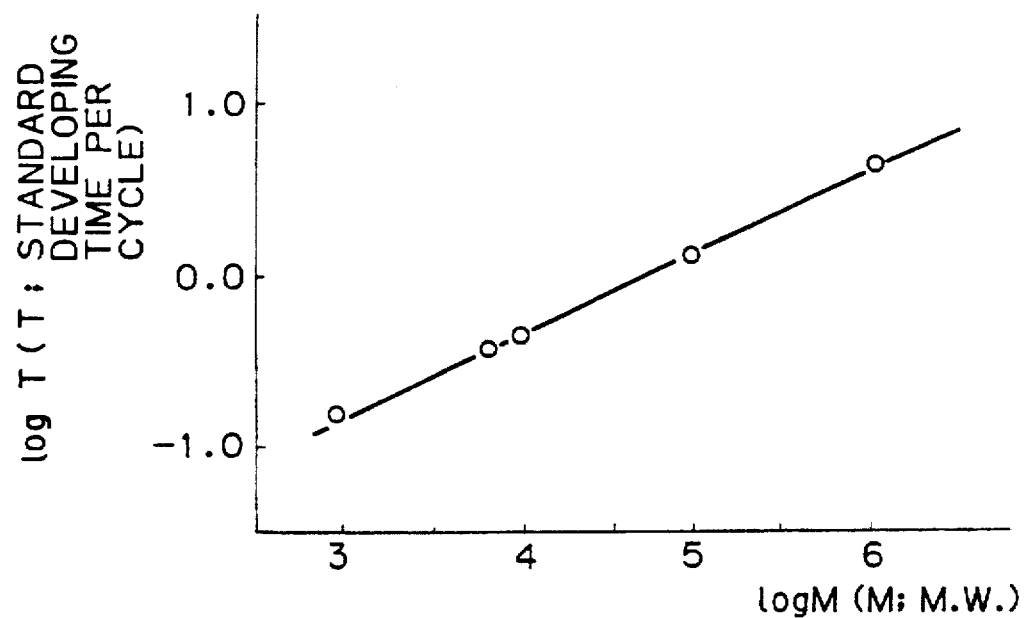
FIG. 17 is a characteristic curve illustrating the relationship between the molecular weight of the resist material and the standard value of the development time of one cycle.

The relationship between the development time of one cycle not causing deformation of the pattern and the molecular weight of the polymer material used for the resist film 11 is illustrated in FIG. 17. Accordingly, by deciding the etching time of one cycle according to the molecular weight and conducting the development for the so-decided development time, a resist mask having a high precision can be formed.

Note, the speed of diffusion of the solvent in the polymer is substantially represented by the formula of $S=50M^{-0.45}$ μm/sec (quoted from J. Polymer Sci., 57, 187, 1962; this formula indicates a diffusion of toluene in polystyrene and M in the formula represents the molecular weight). The results shown in FIG. 17 are derived in due consideration of this diffusion speed.

For example, if the molecular weight is 7200, S is equal to 0.9 μm/sec, and the development time of 0.5 second corresponds to the liquid developer intrusion depth of about 0.45 μm. The development time allowing this intrusion depth (0.45 μm) is determined with respect to each molecular weight, and the obtained results are plotted in FIG. 17. Since the intrusion speed is reduced with an increase of the molecular weight (0.2 second at a molecular weight of 1,000, 0.57 second at a molecular weight of 10,000, 1.6 seconds at a molecular weight of 100,000 and 4.5 seconds at a molecular weight of 1,000,000), if the molecular weight is high, a longer liquid developer supply time per cycle is allowed.

If the development is intermittently carried out for a step time shorter than the standard time shown in FIG. 17, a good pattern can be obtained. Moreover, the necessary step time depends on the thickness of the resist film, and preferably the step time is set at a value smaller than the time allowing an intrusion of the liquid developer into the resist film along a depth corresponding to ⅓ of the thickness of the resist film. For example, in the above embodiment, the step time is set at 1 second in the case of a resist film having a thickness of 2.4 μm, and at 0.25 second in the case of a resist film having a thickness of 0.65 μm.

The development, rinsing, and drying operations are thus repeated a plurality of times, and the developed resist film 11 is used as a mask at the subsequent processing step. The underground (i.e., underlying) aluminum film 10, exposed through the patterned resist film 11, is wet-etched with a phosphorous acid-containing liquid or the like or is dry-etched with a chlorine-containing gas, whereby an aluminum printed pattern, of separate electrodes is formed on the semiconductor substrate 2 (see FIG. 10H).

In the foregoing embodiment, the development of the resist film 11 is effected through the development, rinsing and drying treatments. Nevertheless, in general, a swelling of the resist film can be prevented by repeating the development and drying treatments, if the developer used has a low boiling point and a high volatility. The fundamental feature of the present invention resides in the repetition of the development and drying treatments.

In the foregoing embodiment, a patterning exposure of the resist film 11 is performed with electron beams, but the patterning exposure is also accomplished by using ion beams or with X-rays or light by using a photo-mask.

Chloromethylated polystyrene (CMS) is used as the resist material in the foregoing embodiment and this resist material is developed with a liquid mixture of acetone and isopropyl alcohol. Other resist materials as mentioned below can be used.

Namely, chloromethylated polydiphenylsiloxane (SNR) and polymethylsylsesquioxane (PMSS) are used and resist films formed therefrom are developed with a ketone type solvent such as methylisobutylketone (MIBK) or methylethylketone (MEK) or an ester type solvent such as ethyl acetate. Furthermore, a resist film formed from a resist material such as polydiallyl o-phthalate (PDAOP) is developed with a liquid mixture of monochlorobenzene and isoamyl acetate. Moreover, polyglycidyl methacrylate (PGMA) and a glycidyl methacrylate/ethyl acrylate copolymer (COP) are used as the resist material and resist films of these materials are developed with acetone and isopropyl alcohol. In each case, if the development and drying treatments are intermittently carried out a plurality of times, the development can be accomplished without a swelling of the resist pattern.

When a cyclized rubber type resist material, a polyvinyl cinnamate type resist material, a styrene type resist material, an acrylic resist material, a silicone type resist material, and other crosslinking resist material are used for the formation of masks, the above-mentioned resist-patterning process can be similarly applied.

The process of the present invention is effective for preventing cracking when a positive resist material is used.

More specifically, the process of the present invention is especially effective for preventing cracking at the development of positive resist materials such as polymethyl methacrylate (PMMA)-co-methacrylic acid and polymethyl methacrylate (PMMA)-co-methacrylic chloride in the resist-patterning process.

For example, in the usual development process in which the development is conducted for 20 seconds and the rinsing is conducted for 10 seconds in sequence on a rotated wafer by the spray method, cracking occurs in the foregoing positive resist materials if the thickness exceeds 1.7 μm. In contrast, if the foregoing positive resist materials are developed by repeating the operation cycle of development for a step time of 0.5 second, 5 seconds' rinsing, and 5 seconds' drying (high-speed spin drying at 2000 rpm) 40 times, cracking does not occur even if the thickness is larger than 2 μm. In this embodiment, a 1/1 liquid mixture of methylisobutylketone and ethyl acetate is used as the liquid developer and isopropyl alcohol is used as the rinsing liquid.

An embodiment in which the above-mentioned process is applied to polychloromethylated polystyrene having a molecular weight of 100,000 will now be described. Namely, in the present embodiment, a resist film of polychloromethylated polystyrene which has a thickness of 1.0 μm is developed at a pattern width of 1.0 μm in a line-and-space stripe pattern in the same manner as described above. Since the diffusion rate S defined by the above-mentioned formula is about $50M^{-0.45}$, if the molecular weight is 100, 000, the intrusion speed of the liquid developer is 0.28 μm/sec. Accordingly, the time required for the liquid developer to intrude into the resist film to a depth corresponding to about ⅓ of the film thickness is about 1.2 seconds. The step development time is adjusted to 1 second, the rising time is adjusted to 5 seconds, and the drying time is adjusted to 5 seconds, and these treatments are repeated 20 times as a whole, whereby a good pattern having no substantial deformation is obtained. A 9/1 liquid mixture of isoamyl acetate and ethyl cellosolve is used as the liquid developer, and IPA (isopropyl alcohol) is used as the rinsing liquid. The drying is carried out under a high rotation (4000 rpm). When the step development time is changed to 1.5 seconds and the development is repeated 13 times, a slight deformation of the pattern is caused, and if the development is continuously carried out for 20 seconds, conspicuous meandering and deformation of the pattern are caused by a swelling of the resist film.

As apparent from the foregoing description, even if the construction is changed by appropriately adjusting the short development time, deformation of the pattern by swelling can be minimized and a good pattern can be obtained.

The process of the present invention using the above-mentioned positive resist material will now be described. For example, the process is conducted according to procedures shown in FIGS. 15A through 15H. The steps shown in FIGS. 15A through 15H are the same as those shown in FIGS. 10A through 10H, described in detail hereinbefore, except that the positive resist material is used instead of the negative resist material, the rinsing treatment is carried out in addition to the drying treatment, and the interlaminar insulating film 9 is used instead of the aluminum film 10 as the film to be processed. Accordingly, an explanation of these steps is omitted but, as is obvious, the series of these operations prevents the formation of cracks on the pattern edge.

Still further, when working the process of the present invention, not only aluminum but also a silicon oxide film, silicon, chromium, a polymer, PSG, high-melting-point metals such as tungsten and tantalum, and gold can be used as the film to be processed. In the foregoing embodiments, electrodes are formed, but other patterns can be similarly prepared according to the process of the present invention.

The process of the present invention is especially effective when a resist material showing a large swelling in the liquid developer is used. Especially prominent effects can be obtained when a crosslinking resist material is used as the resist material (by the crosslinking resist material is meant a resist material in which a pattern is formed based on a difference of dissolution caused by a difference of the crosslinking degree).

The present invention will be further described with regard to typical examples of the resist developing apparatuses of the present invention with reference to FIGS. 19 to 21.

FIG. 19 is a perspective view illustrating a part of the resist developing apparatus according to one embodiment of the present invention, in which drawing, to simplify the explanation of the constitution of the apparatus, only one set of developer-supplying system and rinsing solution-supplying system is included. In the developer-supplying system 51, a developing chamber 60 has a spray nozzle 61 for spraying the developer from the source of developer (not shown), and a slit-like opening 62 for selectively distributing the sprayed developer onto a predetermined area of the wafer 56 carrying the exposed resist coating (not shown). The developer not passed through the opening 62 is discharged through an outlet pipe 63. As illustrated, a bottom wall of the chamber 60 adjacent to the opening 62 has an upwardly projected lip to prevent overflow of the developer collected in the bottom portion of the chamber 60.

The rinsing solution-supplying system 52 has a structure which corresponds to that of the illustrated developer-supplying system, and in this system a rinsing chamber 70 has a spray nozzle 71 for rinsing solution, opening 72 and an outlet pipe 73 for discharging the unused rinsing solution. In the downstream side of the rinsing solution-supplying system, a nitrogen gun 53 for removing the rinsing solution on the moving wafer 56 and a hot plate 54 for drying the wafer 56 are disposed in the illustrated order. Note, to conduct the intermittent development, two or more sets of the illustrated combination of the developer-supplying system 51, rinsing solution-supplying system 52, nitrogen blower or nitrogen-blowing gun 53 and hot plate 54 are disposed on a conveyor lane 55.

Using the developing apparatus of FIG. 19, the development of the exposed resist coating according to the present invention can be carried out as follows.

The wafer 56 used herein is a silicon wafer, and has a coating of resist: for example, chloromethylated polystyrene, having a layer thickness of about 1 μm applied thereon. After the resist coating was pattern-wise exposed to electron beams, the wafer 56 is located on the conveyor lane 55, and guided to a position beneath the slit-like opening 62 of the developing chamber 60. While the wafer 56 is positioned beneath the opening 62, a developer such as a mixed solution of ethyl cellosolve and isoamyl acetate is sprayed from the spray nozzle 61. The thus sprayed developer is distributed through the opening 62 over a limited area of the resist coating, and thus the resist coating is successively developed with the movement of the wafer 56 carrying the resist coating. In this successive development, assuming that the conveyor lane 55 is driven at a conveying speed of 20 cm/sec., and that a distance from the slit-like opening 62 of the chamber 60 to the end of the opening 72 of the rinsing chamber 70 is a 10 cm length, the wafer 56 on the lane 55 is guided to a position beneath an end of the opening 72 of the rinsing chamber 70 after 0.5 seconds. Under the opening 72 of the rinsing chamber 70, the wafer 56 is sprayed with the rinsing solution from the spray nozzle 71 to remove the remaining developer on the developed resist coating of the wafer 56. The rinsing solution sprayed from the nozzle 71 is, for example, isopropyl alcohol.

After rinsing of the developed resist coating, a nitrogen gas from the nitrogen blower or nitrogen-blowing gun 53 is then directed onto a surface of the rinsed resist coating to remove the remainder of the rinsing solution therefrom. Since the wafer 56 is then guided beneath the hot plate 54, it is heated at 50° C. for about one second to thereby dry the resist coating. After the drying was completed, the once developed wafer 56 is guided to a next set of developer-supplying system, rinsing solution-supplying system, nitrogen-blowing gun and hot plate. Accordingly, two or more cycles of the developing, rinsing, and drying are repeated per one rotation of the conveyor lane 55. The resist pattern having a high resolution is thus obtained.

FIG. 20 is a perspective view illustrating a part of the resist developing apparatus according to another embodiment of the present invention. In this developing device, a conveyor lane 55 is not rotatable, but is moved straight, and a developing and rinsing chamber is not used, but a tubular body for supplying the developer or rinsing solution is disposed over and across the conveyor lane 55. As illustrated, the developer-supplying system 51 has a horizontal tubular body 64 communicated through a feed pipe 66 to a source of developer (not shown). A bottom portion of the tubular body 64 has one array of holes 65 for dropping the developer formed therein, and the developer from the holes 65 is dropped to (i.e., onto) a limited area of the wafer 56 when the wafer 56 is just passed beneath the holes 65. Note, an array of the holes 65 is disposed over the conveyor lane 55 so that a direction of the array becomes perpendicular to the direction of the movement of the lane 55.

The rinsing solution-supplying system 52 is disposed apart from the developer-supplying system 51, and a structure of the system 52 is substantially the same as that of the system 51. Namely, the rinsing solution-supplying system 52 comprises a tubular body 74 for supplying the rinsing solution communicated through a feed pipe 76 to a source of rinsing solution (not shown), and a bottom portion of the tubular body 74 has an array of holes 75 for dropping the rinsing solution toward (i.e., onto) the moving wafer 56.

A nitrogen blower or nitrogen-blowing gun 53 is used to remove the remainder of the rinsing solution from the rinsed resist coating, and a hot plate 54 is used to dry the developed and rinsed resist coating. After the drying is completed, the once developed wafer 56 is guided to a next set of developer-supplying system, rinsing solution-supplying system, nitrogen-blowing gun and hot plate. Note, in the illustrated developing device, the developing time can be freely controlled by changing a conveying speed of the wafer 56 and a distance between the developer-supplying system 51 and rinsing solution-supplying system 52.

FIG. 21 illustrates a modification of the developing apparatus of FIG. 20. As illustrated, all of the developer-supplying system 51, rinsing solution-supplying system 52, outlet 53a of nitrogen jet and heater 54a are mounted on a circumferential surface of the rotatable drum 80 at a predetermined distance of space. During guiding of the wafer 56 on the conveyor lane 55 beneath the drum 80, one cycle of developing, rinsing and drying is completed per one rotation of the drum 80. Of course, to conduct the intermittent development, two or more drums 80 are disposed over the conveyor lane 55.

As apparent from the descriptions with reference to FIGS. 19 to 21, since the each step of the developing, rinsing and drying of the exposed resist coating is carried out periodically and also exactly, and the application of the developer and rinsing solution is limited to a predetermined area of the resist coating, the developing time can be exactly controlled, and also an unevenness of development on the resist coating of the wafer can be prevented. As a result, various drawbacks due to swelling of the resist such as distortion and the like of the resist pattern or formation of scums or bridges in a narrow gap between the resist patterns can be prevented. Eventually, the developing apparatuses of the present invention are effective in the production of semiconductor devices having fine patterns and high integration degree such as LSIs and VLSIs.

We claim:

1. A process for producing a semiconductor device comprising:
   coating an article to be fabricated into a semiconductor device with a resist material to thereby form a coating of the resist material on the article, said resist material being initially soluble in an organic solvent developer and convertible by exposure to radiation into a cross-linked polymeric substance that is insoluble in said organic solvent developer;
   exposing the coating to a radiation pattern to thereby form a corresponding latent image of the pattern in said coating, said image comprising at least one exposed area of the coating that is insoluble in said organic solvent developer and an adjacent unexposed area of the coating that is soluble in said organic solvent developer;
   contacting said coating with said organic solvent developer for a first period of time which is insufficient to allow the organic solvent developer to permeate into said exposed area to a degree such that the exposed area becomes substantially deformed as a result of the permeation of the organic solvent developer thereinto to thereby present a partially developed coating;
   evaporating organic solvent developer from the partially developed coating to thereby dry said exposed area;
   contacting said partially developed coating with said organic solvent developer for a second period of time which is insufficient to allow the organic solvent developer to permeate into said exposed area to a degree such that the exposed area becomes substantially deformed as a result of the permeation of the organic solvent developer thereinto to thereby present a further developed coating;
   evaporating organic solvent developer from the further developed coating to thereby dry the exposed area for a second time; and
   fabricating a semiconductor device from the article using the exposed area as at least a portion of a mask.

2. A process as set forth in claim 1, wherein each said period of time is shorter than a time which would allow a permeation of the developer into the resist coating to a depth of one-third of the thickness of the latter.

3. A process as set forth in to claim 2, wherein said resist material comprises a polystyrene, a polysiloxane, a polyacrylate, a polymethacrylate, a cyclic rubber, a polyvinyl cinnamate or a polysulfone.

4. A process as set forth in claim 1, wherein said resist material comprises a negative resist material and said latent image comprises a negative resist pattern.

5. A process as set forth in claim 1, wherein said resist material comprises a positive resist material and said latent image comprises a positive resist pattern.

6. A process as set forth in claim 1, comprising rinsing the partially developed coating and the further developed coating with a rinsing solution to remove organic solvent developer therefrom before organic solvent developer is evaporated therefrom.

7. A process as set forth in claim 6, wherein at least one of said contacting steps includes spraying said organic solvent developer onto the coating using a plurality of nozzles.

8. A process as set forth in claim 7, wherein said rinsing step includes spraying said rinsing solution onto the coating using a plurality of nozzles.

9. A process as set forth in claim 6, wherein said rinsing step includes spraying said rinsing solution onto the coating using a plurality of nozzles.

10. A process as set forth in claim 1, wherein at least one of said contacting steps includes spraying said organic solvent developer onto the coating using a plurality of nozzles.

11. A process as set forth in claim 10, wherein said rinsing step includes spraying said rinsing solution onto the coating using a plurality of nozzles.

12. A process as set forth in claim 1, wherein each of said contacting steps includes spraying said organic solvent developer onto the coating using a plurality of nozzles.

13. A process as set forth in claim 12, wherein said rinsing step includes spraying said rinsing solution onto the coating using a plurality of nozzles.

14. A process as set forth in claim 1, wherein said rinsing step includes spraying said rinsing solution onto the coating using a plurality of nozzles.

15. A process for patterning a workpiece in the production of a semiconductor device comprising:
   forming a coating of a resist material on the workpiece, said resist material being initially soluble in an organic solvent developer and convertible by exposure to radiation into a cross-linked polymeric substance that is insoluble in said organic solvent developer;
   exposing the coating to a radiation pattern to thereby form a corresponding latent image of the radiation pattern in the coating, said latent image comprising at least one exposed area of the coating that is insoluble in said organic solvent developer and an adjacent unexposed area of the coating that is soluble in said organic solvent developer;
   contacting said coating with said organic solvent developer for a first period of time which is insufficient to allow the organic solvent developer to permeate into said exposed area to a degree such that the exposed area becomes substantially deformed as a result of the permeation of the organic solvent developer thereinto to thereby present a partially developed coating;

evaporating organic solvent developer from the partially developed coating to thereby dry said exposed area;

contacting said coating with said organic solvent developer for a second period of time which is insufficient to allow the organic solvent developer to permeate into said exposed area to a degree such that the exposed area becomes substantially deformed as a result of the permeation of the organic solvent developer thereinto, whereby to present a further developed coating;

evaporating organic solvent developer from the further developed coating to thereby dry the exposed area for a second time; and fabricating a semiconductor device from the workpiece, utilizing the exposed area as at least a portion of a mask.

16. A process as set forth in claim 15, wherein each said period of time is shorter than a time which would allow a permeation of the developer into the resist coating to a depth of one-third of the thickness of the latter.

17. A process as recited in claim 15, wherein each said contracting step comprises moving the workpiece through a spray of said organic solvent developer to thereby subject said areas of the coating to a uniform application of the developer.

18. A process as set forth in claim 15, comprising rinsing organic solvent developer from the partially developed coating and the further developed coating with a rinsing solution before drying the same.

19. A process as recited in claim 18, further comprising:
forming a spray pattern of said organic solvent developer at a first position;

forming a spray pattern of said rinsing solution at a second position which is displaced from the first position by a distance l; and moving the workpiece during each contacting step at a velocity v, wherein v=l/t and t represents the first period of time in each developing stage, v and l being selected in accordance with the desired first period of time.

20. A process for producing a semiconductor device comprising:
coating an article to be fabricated into a semiconductor device with a resist material to thereby form a coating of the resist material on the article, said resist material being a cross-linkable polymeric resinous substance which is initially soluble in an organic solvent developer and which is radiation sensitive for transformation into an cross-linked, organic solvent insoluble polymeric material upon exposure to radiation, said polymeric material being subject to deformation by swelling if left in contact with said organic solvent developer for longer than a predeterminable period of time;

exposing the coating to a radiation pattern to thereby form a corresponding latent image of the pattern in said coating, said latent image comprising at least one exposed area of the coating that is insoluble in said organic solvent developer and an adjacent unexposed area of the coating that is soluble in said organic solvent developer;

contacting said coating with said organic solvent developer for a first development period of time which is not greater than said predeterminable period of time to thereby initiate the development of the latent image and present a partially developed resist coating;

discontinuing the contacting of the partially developed resist coating with said organic solvent developer at the end of said first development period of time and immediately thereafter evaporating organic solvent developer from the partially developed resist coating to thereby dry said exposed area;

contacting the partially developed resist coating with said organic solvent developer for a second development period of time which is not greater than said predeterminable period of time to thereby continue the development of the latent image and present a further developed resist coating;

discontinuing the contacting of the further developed resist coating with said organic solvent developer at the end of said second development period of time and immediately thereafter evaporating organic solvent developer from the further developed resist coating to thereby dry the exposed area for a second time; and fabricating a semiconductor device from the article, using the exposed area as at least a portion of a mask.

21. A process as set forth in claim 20 wherein said contacting and said evaporating are repeated a plurality of times.

* * * * *

UNITED STATES PATENT AND TRADEMARK OFFICE
CERTIFICATE OF CORRECTION

PATENT NO. : 5,783,367
DATED : July 21, 1998
INVENTOR(S) : Takashi MARUYAMA et al.

It is certified that error appears in the above-indentified patent and that said Letters Patent is hereby corrected as shown below:

Title page item [30], priority information has been omitted. The priority information is:

Japanese Patent Application No. 01-328204
Filed: December 20, 1989.

Signed and Sealed this

Twentieth Day of June, 2000

Attest:

Q. TODD DICKINSON

*Attesting Officer*    *Director of Patents and Trademarks*

UNITED STATES PATENT AND TRADEMARK OFFICE
CERTIFICATE OF CORRECTION

PATENT NO. : 5,783,367
DATED : July 21, 1998
INVENTOR(S) : Takashi MARUYAMA et al.

It is certified that error appears in the above-identified patent and that said Letters Patent is hereby corrected as shown below:

On the Title Page, the priority information has been omitted. The first priority application is as follows:

(1) Japanese Patent Application No. 01-244042
Filed: September 20, 1989

Signed and Sealed this

Thirty-first Day of October, 2000

Attest:

Q. TODD DICKINSON

Attesting Officer

Director of Patents and Trademarks